(12) United States Patent
Ryu

(10) Patent No.: US 8,599,593 B2
(45) Date of Patent: Dec. 3, 2013

(54) MEMORY SYSTEM AND METHOD OF OPERATING THE SAME

(75) Inventor: Seung Han Ryu, Gwangju (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 209 days.

(21) Appl. No.: 13/180,912

(22) Filed: Jul. 12, 2011

(65) Prior Publication Data

US 2012/0057389 A1 Mar. 8, 2012

(30) Foreign Application Priority Data

Sep. 6, 2010 (KR) ........................ 10-2010-0087051

(51) Int. Cl.
*G11C 15/00* (2006.01)
(52) U.S. Cl.
USPC ........................................ 365/49.1; 365/49.17
(58) Field of Classification Search
USPC ................ 365/49, 230.03, 49.1, 49.17
See application file for complete search history.

(56) References Cited

U.S. PATENT DOCUMENTS

| 5,010,516 A * | 4/1991 | Oates .......................... 365/49.15 |
| 2007/0061507 A1* | 3/2007 | Iwanari et al. ................. 711/107 |

FOREIGN PATENT DOCUMENTS

| JP | 2008-533569 | 8/2008 |
| JP | 2010-049722 | 3/2010 |

* cited by examiner

*Primary Examiner* — Huan Hoang
(74) *Attorney, Agent, or Firm* — IP & T Group LLP

(57) ABSTRACT

A memory system includes a memory device configured to read control data for operating conditions from a content addressed memory (CAM) block by performing a CAM read operation and to perform a data input/output operation based on the control data and a memory controller configured to store the control data of the memory device and to determine whether the memory device is to perform the CAM read operation by comparing the stored control data with the control data of the memory device when an operating mode of the memory device or the memory controller changes.

18 Claims, 3 Drawing Sheets

MEMORY SYSTEM AND METHOD OF OPERATING THE SAME

CROSS-REFERENCE TO RELATED APPLICATION

Priority to Korean patent application number 10-2010-0087051 filed on Sep. 6, 2010, the entire disclosure of which is incorporated by reference herein, is claimed.

BACKGROUND

Exemplary embodiments relate to a memory system and a method of operating the same and, more particularly, to a memory system and a method of operating the same which are capable of reducing power consumption.

A memory system may include a memory device and a memory controller for controlling the operation of the memory device. The memory device has varying operating characteristics depending on its manufacture process. For this reason, the memory device sets parameters in terms of operating conditions, such as the operating characteristic, in a nonvolatile memory region, reads the parameters from the memory region when power is supplied, and stores the read parameters in the register of a control circuit within the memory device. The memory device operates under conditions set based on the parameters stored in the register.

In a NAND flash memory device, parameters related to an operating characteristic are stored in a content addressed memory (hereinafter referred to as a 'CAM') block. When power is supplied, the parameters are read from the CAM block and stored in the register of a control circuit within the NAND flash memory device. In a program operation, an erase operation, or a read operation, the control circuit controls an operation for data storage, data read, or data erasure for memory cells based on the parameters stored in the internal register.

Such an operation where the parameters of the CAM block are stored in the register of the control circuit when power is supplied may be referred to as a 'CAM read operation'. Power consumption may increase owing to the CAM read operation.

A memory system may have the largest amount of power consumption in a state that both a memory controller and a memory device are in the active mode. When the memory controller is in the idle mode and the memory device is in the active mode, the power consumption may decrease. In a state that the memory controller is in the idle mode and the memory device is turned off, the memory system may have the smallest amount of power consumption.

When a memory system switches between those states, a memory device always performs the CAM read operation. In other words, the CAM read operation may be performed even when operating conditions of the memory device are maintained, thereby increasing power consumption.

BRIEF SUMMARY

According to exemplary embodiments, the entire power consumption may be reduced by detecting a change in the state of a memory controller or a memory device and controlling the memory device to perform the CAM read operation based on the change in the state.

A memory system according to an aspect of the present disclosure includes a memory device configured to read control data for operating conditions from a content addressed memory (CAM) block by performing a CAM read operation and to perform a data input/output operation based on the control data and a memory controller configured to store the control data of the memory device and to determine whether the memory device is to perform the CAM read operation by comparing the stored control data with the control data of the memory device when an operating mode of the memory device or the memory controller changes.

A memory system according to another aspect of the present disclosure includes a plurality of memory devices each configured to store control data related to operating conditions in a first register and perform a data input/output operation based on the control data, wherein the control data are read from a content addressed memory (CAM) block through a CAM read operation and a memory controller comprising second registers for storing the control data of the respective memory devices and configured to determine whether the memory devices perform the CAM read operation by comparing the control data of the second registers with the control data of the first registers, respectively, when an operating mode of the memory device or the memory controller changes.

A method of operating a memory system according to yet another aspect of the present disclosure includes performing a CAM read operation to store data for operating conditions in a first register of a memory device, storing the data of the first register in a second register of a memory controller, comparing the data of the first register with the data of the second register when a change in a state of the memory device or the memory controller is detected, and controlling the memory device to perform the CAM read operation and updating the data of the second register when the data of the first register are not identical with the data of the second register as a result of the comparison,.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
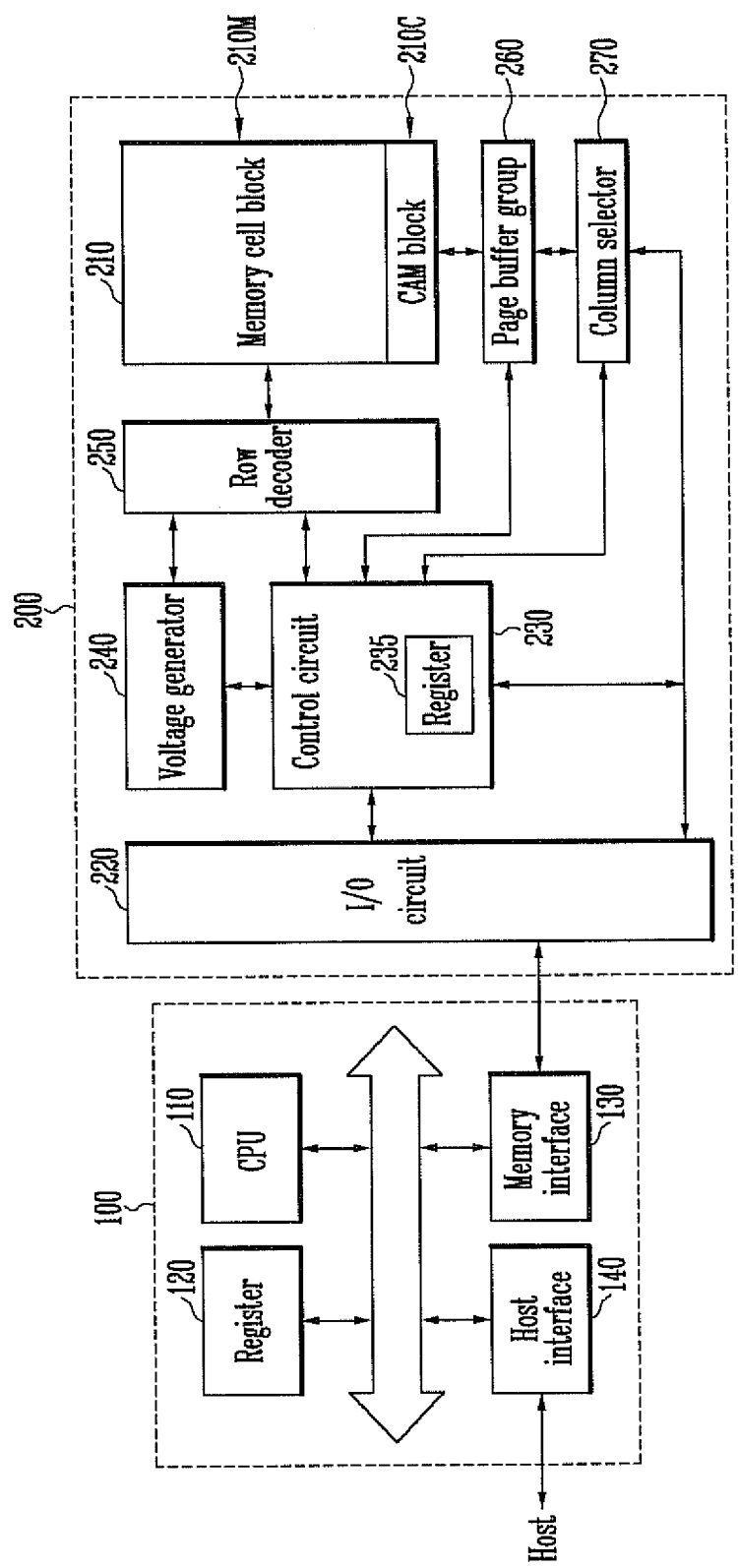
FIG. 1 is a block diagram of a memory system according to an exemplary embodiment of this disclosure.

FIG. 1 is a block diagram of a memory system according to an exemplary embodiment of this disclosure.

Referring to FIG. 1, the memory system includes a memory controller 100 and a memory device 200.

The memory device 200 is configured to store parameters related to operating conditions, read from a CAM block 210C, in a first register 235 when the CAM read operation is performed, and it is configured to perform an operation of inputting and outputting data under the operating conditions set in the parameters stored in the first register 235. The memory controller 100 includes a second register 120 for storing the parameters of the memory device 200. When a state of the memory control 100 or the memory device 200, e.g., an operating mode, is changed, the memory controller 100 determines whether to perform the CAM read operation by comparing the parameters stored in the second register 120 and the parameters stored in the first register 235. This is described in more detail as follows.

The memory device 200 includes a memory cell array 210, an operation circuit group (220, 240, 250, 260, and 270), and a control circuit 230.

The memory cell array 210 includes memory cell blocks 210M for storing data and a CAM block 210C for storing parameters related to operating conditions. Here, the parameters may include information, i.e., control data, about an address of a defective column, including a defective cell, and levels of operation voltages generated for a data I/O operation. In a NAND flash memory device, each of the memory cell blocks 210M may include a plurality of memory strings coupled between bit lines and a common source line. The NAND flash memory device is widely used, and a detailed description of its memory cell block 210M is omitted. Meanwhile, the CAM block 210C may have the same structure as the memory cell block 210M.

The operation circuit group includes a voltage supply circuit (240, 250), a page buffer group 260, a column selector 270, and an I/O circuit 220.

The voltage supply circuit (240, 250) supplies operation voltages for a program operation, an erase operation, or a read operation of memory cells included in the memory cell block 210M to a selected memory cell block. The voltage supply circuit includes a voltage generator 240 and a row decoder 250.

The voltage generator 240 generates the operation voltages for the program operation, the erase operation, or the read operation of memory cells of the memory cell block 210M or CAM cells of the CAM block 210C in response to an internal command signal generated by the control circuit 230.

The row decoder 250 transfers the operation voltages of the voltage generator 240 to the memory cell block 210M, selected from among the memory cell blocks of the memory cell array 210, in response to row address signals of the control circuit 230.

The page buffer group 260 includes a plurality of page buffers for latching data stored in the memory cells of the memory cell block 210M or parameters stored in the CAM cells of the CAM block 210C.

The column selector 270 sequentially selects the page buffers of the page buffer group 260 in response to column address signals generated by the control circuit 230 and outputs data stored in the selected page buffers.

The I/O circuit 220 transfers a command signal and an address signal, received from the memory controller 100, to the control circuit 230 or transfers parameters, stored in the first register 235 of the control circuit 230, to the memory controller 100. Furthermore, the I/O circuit 220 transfers external input data to the column selector 270 so that the external input data is inputted to the page buffer group 260. Furthermore, when a read operation is performed, the I/O circuit 220 externally outputs data received from the page buffers of the page buffer group 260 via the column selector 270.

The control circuit 230 includes the first register 235 for storing parameters read from the CAM block 210C and controls the operation circuit group (220, 240, 250, 260, and 270) to operate under operating conditions set in the parameters. When power starts being supplied to the memory device 200, the control circuit 230 controls the operation circuit group (220, 240, 250, 260, and 270) to read the parameters through the CAM read operation and store it in the first register 235. Furthermore, on the request of the memory controller 100, the control circuit 230 may output the parameters, stored in the first register 235, to the memory controller 100 or may output the parameters, read by the CAM read operation, to the memory controller 100 after performing the CAM read operation.

The memory controller 100 may include a central processing unit (CPU) 110, the second register 120, a memory interface 130, and a host interface 140. The host interface 140 operates according to the data exchange protocol of a host coupled to the memory system. The memory interface 130 interfaces with the memory device 200.

The second register 120 may store parameters outputted by the memory device 200. When a state of the memory controller 100 or the memory device 200 is changed, the CPU 110 compares parameters stored in the second register 120 and the first register 235 and controls whether to perform the CAM read operation for the memory device 200 based on a result of the comparison. For example, when the memory controller 100 or the memory device 200 switches from the idle mode to the active mode, the CPU 110 of the memory controller 100 compares parameters stored in the second and the first registers 120 and 235. If, as a result of the comparison, the parameters stored in the second and the first registers 120 and 235 are not identical with each other, the CPU 110 controls the memory device 200 so that the memory device 200 performs the CAM read operation again.

A method of operating the memory system having the above structure is described as follows.

Figure 2:
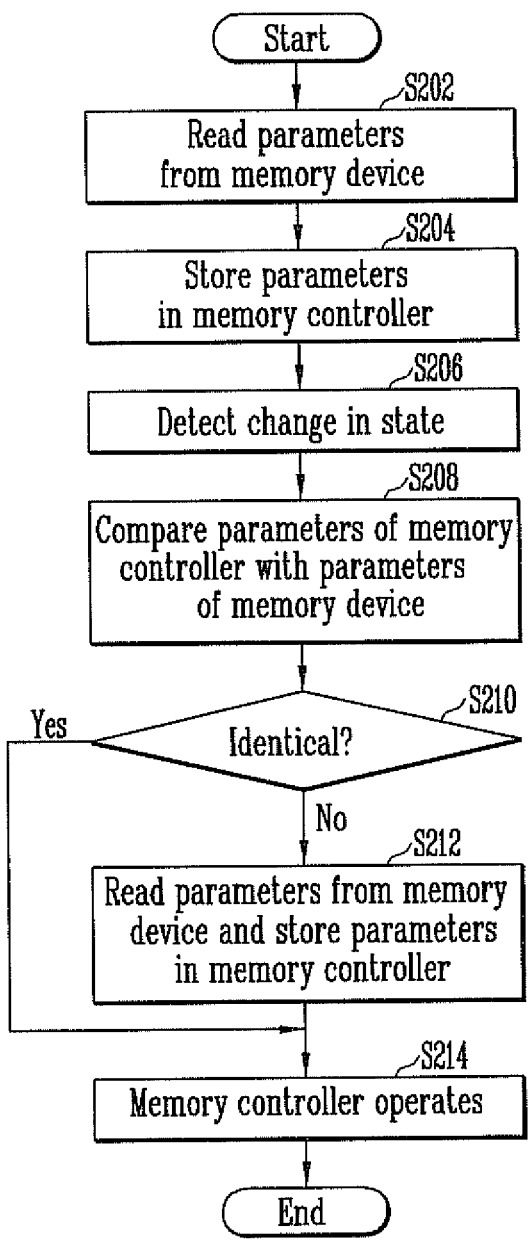
FIG. 2 is a flowchart illustrating a method of operating the memory system according to an exemplary embodiment of this disclosure.

FIG. 2 is a flowchart illustrating the method of operating the memory system according to an exemplary embodiment of this disclosure.

Referring to FIGS. 1 and 2, when power starts being supplied to the memory device 200, the control circuit 230 controls the operation circuit group (220, 240, 250, 260, and 270) in order to perform the CAM read operation at step S202. Parameters stored in the CAM block 210C are transferred to the first register 235 of the control circuit 230 by means of the CAM read operation.

At step S204, the parameters stored in the first register 235 of the control circuit 230 are transferred to the second register 120 of the memory controller 100 via the I/O circuit 220 and the memory interface 130.

Next, the memory controller 100 and the memory device 200 operate in response to the request of a host. If there is no further request from the host after the requested operation is completed, the memory controller 100 and the memory device 200 may enter the idle mode.

At step S206, when a state of the memory controller 100 or the memory device 200 is changed, for example, when they switch from an idle mode to an active mode in response to a new command inputted by the host, the CPU 110 of the memory controller 100 detects a change in the state. For example, at the moment when the memory device 200, such as a NAND flash memory device, is mounted on the slot of an electronic device, the CPU 110 of the memory controller 100 may consider such a mount as a change in the state of the memory device 200.

At step S208, when a change in the state is detected, the CPU 110 of the memory controller 100 compares parameters stored in the second register 120 of the memory controller 100 and parameters stored in the first register 235 of the memory device 200. To this end, when a change in the state is detected, the memory controller 100 may request the control circuit 230 of the memory device 200 to send the parameters thereto.

At step S210, the CPU 110 of the memory controller 100 determines whether the parameters stored in the second register 120 of the memory controller 100 are identical with the parameters stored in the first register 235 of the memory device 200 as a result of the comparison.

At step S212, if, as a result of the determination, the parameters stored in the second register 120 of the memory controller 100 are determined not to be identical with the parameters stored in the first register 235 of the memory device 200, the CPU 110 of the memory controller 100 determines that operating conditions of the memory device 200 has changed. The memory controller 100 controls the memory device 200 to perform the CAM read operation and send parameters read by the CAM read operation to the memory controller 100. Furthermore, the memory controller 100 updates the parameters of the second register 120 with the sent parameters.

Meanwhile, when power starts being supplied, the memory device 200 stores parameters in the first register 235 of the control circuit 230 by automatically performing the CAM read operation. At this time, if the parameters stored in the second register 120 are not identical with the parameters stored in the first register 235, the memory controller 100 may control the memory device 200 to send the parameters stored in the first register 235 to the memory controller 100 without the CAM read operation.

When the memory device 200 switches from a power-off state to other states, the parameters stored in the first register 235 of the memory device 200 may be erroneously changed. Furthermore, it is same when the memory controller 100 switches from the idle mode to the active mode. In order to secure more accurate parameters, if, as a result of a comparison, parameters stored in the second and first registers 120 and 235 are not identical with each other, the memory controller 100 preferably controls the memory device 200 to perform the CAM read operation.

At step S214, after the CAM read operation is finished, the memory controller 100 controls the memory device 200 on the request of the host so that an operation of inputting and outputting data is performed.

if, as a result of the determination at step S210, the parameters stored in the second register 120 of the memory controller 100 are determined to be identical with the parameters stored in the first register 235 of the memory device 200, the CPU 110 of the memory controller 100 controls the memory device 200 to perform a data I/O operation on the request of the host without performing the CAM read operation.

Figure 3:
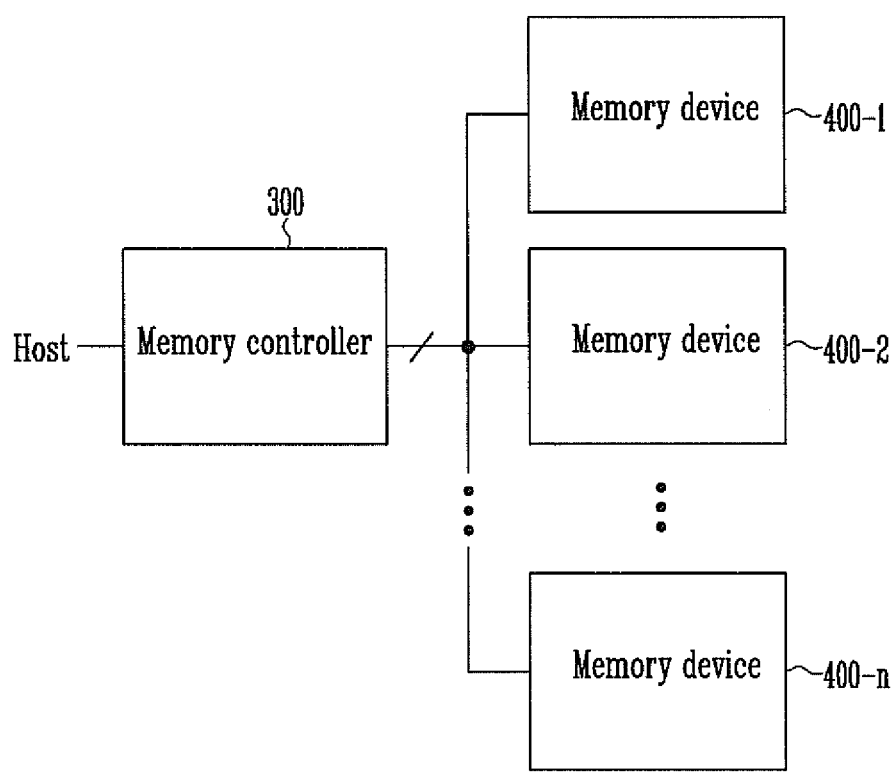
FIG. 3 is a block diagram of a memory system according to another exemplary embodiment of this disclosure.

FIG. 3 is a block diagram of a memory system according to another exemplary embodiment of this disclosure.

Referring to FIG. 3, one memory controller 300 may control a plurality of memory devices 400-1 to 400-n in a multi-chip package. That is, the memory controller 300 may control whether to perform the CAM read operations of the memory devices 400-1 to 400-n using the configuration and method described with reference to FIGS. 1 and 2.

In order for the memory controller 300 to control the plurality of memory devices 400-1 to 400-n, a plurality of registers (see a register 120 of FIG. 1) for storing the parameters of the memory devices 400-1 to 400-n may be included in the memory controller 300. Furthermore, when a change in the state of the memory controller, the memory devices, or the memory system including them is detected, the memory controller 300 compares parameters stored therein with respective parameters stored in the memory devices 400-1 to 400-n. If, as a result of the comparison, the parameters stored in the memory controller 300 are not identical with the parameters stored in the memory devices 400-1 to 400-n, the memory controller 300 may control the memory devices 400-1 to 400-n so that only a memory device, not having the parameters identical with the parameters of the memory controller 300, selectively performs the CAM read operation.

In general, when the memory devices 400-1 to 400-n perform the CAM read operations at the same time, consumption current is sharply increased. In order to prevent such a sharp increase, the memory devices 400-1 to 400-n sequentially perform the CAM read operations. In this case, the time taken to fully perform the CAM read operations is increased. According to the present disclosure, however, when only memory devices not having identical parameters perform the CAM read operation, a sharp increase in consumption current can be prevented, and the time taken to perform the CAM read operations can be reduced.

According to the embodiments of this disclosure, a change in the state of the memory controller and the memory device is detected. The CAM read operation is performed only when operating conditions of the memory device have changed based on a change in the state. Accordingly, the entire power consumption can be reduced.

What is claimed is:

1. A memory system, comprising:
a memory device configured to read control data for operating conditions from a content addressed memory (CAM) block by performing a CAM read operation and to perform a data input/output operation based on the control data; and
a memory controller configured to store the control data of the memory device and to determine whether the memory device is to perform the CAM read operation by comparing the stored control data with the control data of the memory device when an operating mode of the memory device or the memory controller changes.
wherein the memory controller is configured to control the memory device to perform the CAM read operation, when the stored control data are not identical with the control data of the memory device.

2. The memory system of claim 1, wherein the memory device comprises: a memory cell array configured to store data; the CAM block configured to store the control data; an operation circuit group configured to perform operations of inputting, erasing, and outputting the data; and a control circuit configured to control the operation circuit group to perform the operations under the operating conditions set in the control data.

3. The memory system of claim 2, wherein the control circuit includes a first register in which the memory device is configured to store the control data read from the CAM block.

4. The memory system of claim 1, wherein when power starts being supplied to the memory device, the memory device is configured to perform the CAM read operation.

5. The memory system of claim 1, wherein when the memory controller detects a change in the operating mode, the memory controller is configured to control the memory device to perform the CAM read operation based on a result of the comparison.

6. The memory system of claim 1, wherein after the memory device performs the CAM read operation under the control of the memory controller, the memory controller is configured to update the stored control data with the control data of the memory device.

7. The memory system of claim 1, wherein when the operating mode is changed from an idle mode to an active mode, the memory controller is configured to compare the stored control data with the control data of the memory device.

8. A memory system, comprising:
a plurality of memory devices each configured to store control data related to operating conditions in a first register and perform a data input/output operation based on the control data, wherein the control data are read from a content addressed memory (CAM) block through a CAM read operation; and a memory controller comprising second registers for storing the control data of the respective memory devices and configured to determine whether the memory devices are to perform the CAM read operation by comparing the control data of the second registers with the control data of the first registers, respectively, when an operating mode of the memory device or the memory controller changes.

9. The memory system of claim 8, wherein the memory device comprises: a memory cell array configured to store storing data; the CAM block configured to store the control data; an operation circuit group configured to perform operations of inputting, erasing, and outputting the data; and a control circuit configured to control the operation circuit group to perform the operations under the operating conditions set in the control data.

10. The memory system of claim 9, wherein the control circuit includes the first register.

11. The memory system of claim 8, wherein when power starts being supplied to the memory device, the memory device is configured to perform the CAM read operation.

12. The memory system of claim 8, wherein when the memory controller detects a change in the operating mode, the memory controller is configured to control the memory device to perform the CAM read operation based on a result of the comparison.

13. The memory system of claim 8, wherein when the operating mode is changed from an idle mode to an active mode, the memory controller is configured to compare the control data of the second registers with the control data of the first registers, respectively.

14. The memory system of claim 8, wherein when a memory device whose control data are not identical with the control data of the corresponding second register is detected among the memory devices, the memory controller is configured to control the detected memory device to perform the CAM read operation.

15. The memory system of claim 14, wherein after the detected memory device performs the CAM read operation under the control of the memory controller, the memory controller is configured to store the control data, stored in the first register of the detected memory device, in the corresponding second register.

16. A method of operating a memory system, comprising:
performing a CAM read operation to store data for operating conditions in a first register of a memory device;
storing the data of the first register in a second register of a memory controller;
comparing the data of the first register with the data of the second register when a change in a state of the memory device or the memory controller is detected; and
controlling the memory device to perform the CAM read operation and updating the data of the second register when the data of the first register are not identical with the data of the second register as a result of the comparison.

17. The method of claim 16, wherein the CAM read operation is performed when power starts being supplied to the memory device.

18. The method of claim 16, wherein when the state is changed from an idle operating mode to an active operating mode, the comparing of the data is performed.

* * * * *